(12) United States Patent
Tan et al.

(10) Patent No.: US 12,162,145 B2
(45) Date of Patent: Dec. 10, 2024

(54) SUBSTRATE CONVEYING ROBOT AND SUBSTRATE CONVEYING ROBOT SYSTEM

(71) Applicants: KAWASAKI JUKOGYO KABUSHIKI KAISHA, Kobe (JP); Kawasaki Robotics (USA), INC., Wixom, MI (US)

(72) Inventors: Haruhiko Tan, Kobe (JP); Shota Tominaga, Santa Clara, CA (US); Avish Ashok Bharwani, Santa Clara, CA (US); Simon Jeyapalan, Newark, CA (US)

(73) Assignees: KAWASAKI JUKOGYO KABUSHIKI KAISHA, Kobe (JP); KAWASAKI ROBOTICS (USA), INC.

(*) Notice: Subject to any disclaimer, the term of this patent is extended or adjusted under 35 U.S.C. 154(b) by 402 days.

(21) Appl. No.: 17/528,212

(22) Filed: Nov. 17, 2021

(65) Prior Publication Data
US 2023/0150120 A1    May 18, 2023

(51) Int. Cl.
*H01L 21/687* (2006.01)
*B25J 9/08* (2006.01)
*B25J 11/00* (2006.01)
*B25J 13/08* (2006.01)
*H01L 21/677* (2006.01)

(52) U.S. Cl.
CPC ............. *B25J 9/08* (2013.01); *B25J 11/0095* (2013.01); *H01L 21/67712* (2013.01); *H01L 21/68707* (2013.01); *B25J 13/08* (2013.01); *G05B 2219/33226* (2013.01); *G05B 2219/45054* (2013.01)

(58) Field of Classification Search
CPC .......... B25J 9/08; B25J 11/0095; B25J 13/08; H01L 21/67712; H01L 21/68707; H01L 21/67259; H01L 21/677; H01L 21/67742; H01L 21/67766; G05B 2219/33226; G05B 2219/45054
See application file for complete search history.

(56) References Cited

U.S. PATENT DOCUMENTS

| | | | | |
|---|---|---|---|---|
| 10,040,193 B2* | 8/2018 | Kobayashi | ........... | G05B 19/041 |
| 10,300,605 B2* | 5/2019 | Sato | ....................... | B25J 13/085 |
| 2001/0016157 A1* | 8/2001 | Sundar | .............. | H01L 21/67742 |
| | | | | 414/217 |

(Continued)

FOREIGN PATENT DOCUMENTS

| CN | 102176425 A | * | 9/2011 | ............ | B25J 11/008 |
|---|---|---|---|---|---|
| JP | 2009-076215 A | | 4/2009 | | |

(Continued)

OTHER PUBLICATIONS

KR-20060075051-A Translation (Year: 2006).*

(Continued)

*Primary Examiner* — Kyle T Johnson
(74) *Attorney, Agent, or Firm* — METROLEX IP LAW GROUP, PLLC; Robert L. Scott, Esq.

(57) ABSTRACT

A substrate conveying robot includes an arm, a substrate holding hand, a sensor board to which a sensor is electrically connected, and a control board on which a controller is mounted, the control board including a universal connector connectable to different types of the sensor boards.

12 Claims, 6 Drawing Sheets

(56) References Cited

U.S. PATENT DOCUMENTS

| | | | |
|---|---|---|---|
| 2002/0089655 A1* | 7/2002 | Kida | H01L 21/68707 355/72 |
| 2009/0110532 A1* | 4/2009 | Salek | H01L 21/67225 700/62 |
| 2009/0142163 A1* | 6/2009 | Genetti | H01L 21/67742 414/217 |
| 2009/0143911 A1* | 6/2009 | Gage | H01L 21/67196 901/14 |
| 2017/0165838 A1* | 6/2017 | Sato | B25J 13/088 |
| 2019/0131157 A1* | 5/2019 | Chen | H01L 21/67288 |
| 2020/0307000 A1* | 10/2020 | Maeda | B25J 9/161 |
| 2021/0043484 A1* | 2/2021 | Moura | G06F 18/22 |
| 2023/0150120 A1* | 5/2023 | Tan | H01L 21/67712 700/245 |
| 2024/0025671 A1* | 1/2024 | Tan | B65G 47/905 |

FOREIGN PATENT DOCUMENTS

| | | | | |
|---|---|---|---|---|
| JP | 2015089583 A | * | 5/2015 | |
| JP | 6165286 B1 | | 7/2017 | |
| JP | 6365736 B2 | | 8/2018 | |
| JP | 6690213 B2 | | 4/2020 | |
| JP | 2020-157401 A | | 10/2020 | |
| KR | 20060075051 A | * | 7/2006 | |
| KR | 20160063090 A | * | 6/2016 | H01L 21/67742 |
| KR | 20170077807 A | * | 4/2017 | H01L 21/677 |

OTHER PUBLICATIONS

JP-2015089583-A translation (Year: 2015).*
CN-102176425-A translation (Year: 2011).*
KR-20160063090-A translation (Year: 2016).*
KR-20170077807-A translation (Year: 2017).*

* cited by examiner

SUBSTRATE CONVEYING ROBOT AND SUBSTRATE CONVEYING ROBOT SYSTEM

BACKGROUND OF THE INVENTION

Field of the Invention

The present disclosure relates to a substrate conveying robot and a substrate conveying robot system.

Description of the Background Art

Conventionally, a substrate conveying robot and a substrate conveying robot system each including a control board connected to a sensor are known. Such a substrate conveying robot and a substrate conveying robot system are disclosed in Japanese Patent No. 6365736, for example.

Japanese Patent No. 6365736 discloses a robot including a master device and a slave device that communicates with the master device. The slave device includes a control board including a plurality of interfaces to which different sensors are connected. The slave device transmits predetermined information acquired by the sensors to the master device.

In the robot disclosed in Japanese Patent No. 6365736, the different sensors are connected to the plurality of interfaces of the slave device, as described above. Although not clearly disclosed in Japanese Patent No. 6365736, it is believed that each of the plurality of interfaces can be connected to only one specific preset sensor. In this case, heterogeneous sensors different from the specific sensors cannot be connected to the interfaces, and thus it is difficult for the slave device to acquire the detection values of the heterogeneous sensors. That is, it is disadvantageously difficult to change the type of sensor from which the slave device acquires the detection value according to the application and purpose.

SUMMARY OF THE INVENTION

The present disclosure is intended to solve the above problem. The present invention aims to provide a substrate conveying robot and a substrate conveying robot system in which the type of sensor from which a detection value is acquired by a control board can be easily changed according to the application and purpose.

In order to attain the aforementioned object, a substrate conveying robot according to a first aspect of the present disclosure includes an arm, a substrate holding hand moved by the arm, movably connected to the arm, and including a blade to support a substrate, a sensor board to which a sensor is electrically connected, and a control board on which a controller is mounted, the control board including a universal connector connectable to different types of the sensor boards.

In the substrate conveying robot according to the first aspect of the present disclosure, as described above, the control board includes the universal connector connectable to the different types of the sensor boards. Accordingly, the control board can acquire the detection value of the sensor from each of a plurality of types of sensor boards via one universal connector. Consequently, the type of sensor from which the control board acquires the detection value can be changed simply by changing the type of sensor board connected to the universal connector. Thus, the type of sensor from which the detection value is acquired by the control board can be easily changed according to the application and purpose.

A substrate conveying robot system according to a second aspect of the present disclosure includes a substrate conveying robot, and a robot controller configured or programmed to control the substrate conveying robot. The substrate conveying robot includes an arm, a substrate holding hand moved by the arm, movably connected to the arm, and including a blade to support a substrate, a sensor board to which a sensor is electrically connected, and a control board on which a controller is mounted, the control board including a universal connector connectable to different types of the sensor boards.

In the substrate conveying robot system according to the second aspect of the present disclosure, as described above, the control board includes the universal connector connectable to the different types of the sensor boards. Accordingly, the control board can acquire the detection value of the sensor from each of a plurality of types of sensor boards via one universal connector. Consequently, the type of sensor from which the control board acquires the detection value can be changed simply by changing the type of sensor board connected to the universal connector. Thus, it is possible to provide the substrate conveying robot system capable of easily changing the type of sensor from which the detection value is acquired by the control board according to the application and purpose.

According to the present disclosure, as described above, the type of sensor from which the detection value is acquired by the control board can be easily changed according to the application and purpose.

DESCRIPTION OF THE PREFERRED EMBODIMENTS

An embodiment of the present disclosure is hereinafter described with reference to the drawings.

The configuration of a substrate conveying robot 1 and a substrate conveying robot system 100 according to this embodiment is now described with reference to FIG. 1.

Figure 1:
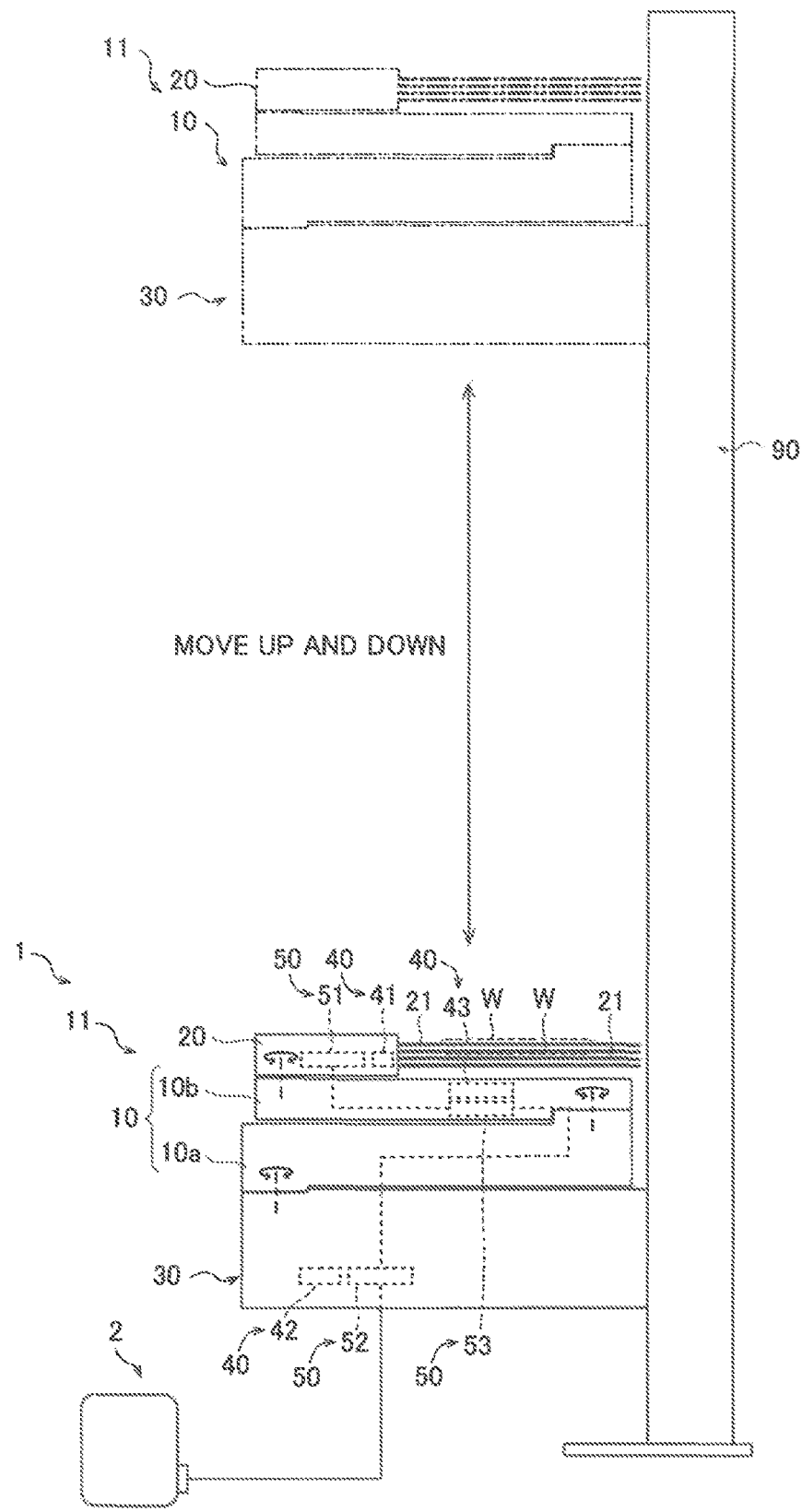
FIG. 1 is a diagram showing the configuration of a substrate conveying robot and a substrate conveying robot system according to an embodiment of the present disclosure.

As shown in FIG. 1, the substrate conveying robot system 100 includes the substrate conveying robot 1 and a robot controller 2. The robot controller 2 controls the substrate conveying robot 1.

The substrate conveying robot 1 includes an arm 10, a substrate holding hand 20, a base 30, a sensor board 40, and a control board 50. The substrate conveying robot 1 includes a substrate conveying robot main body 11 including the arm 10, the substrate holding hand 20, the sensor board 40, and the control board 50. In FIG. 1, for simplification, one sensor board 40 is shown for each of the arm 10, the substrate holding hand 20, and the base 30, but in reality, a plurality of sensor boards 40 are provided on each of the arm 10, the substrate holding hand 20, and the base 30.

The substrate conveying robot 1 is a horizontal articulated robot. Specifically, the substrate holding hand 20 is moved by the arm 10 and rotatably connected to the arm 10. The substrate holding hand 20 includes a blade 21 that supports a semiconductor wafer W. The arm 10 is arranged on the base 30. The arm 10 is rotatably connected to the base 30. Furthermore, a plurality of blades 21 are provided. The semiconductor wafer W is an example of a substrate. The substrate conveying robot 1 may be a robot other than a horizontal articulated robot. For example, the substrate conveying robot 1 may be a vertical articulated robot.

The arm 10 includes a first arm 10a and a second arm 10b. The first arm 10a is rotatable about a first end thereof as a rotation center. A first end of the second arm 10b is rotatably connected to a second end of the first arm 10a and is rotatable with respect to the first arm 10a, and the substrate holding hand 20 is connected to the second arm 10b. The substrate holding hand 20 may also include an upper hand and a lower hand that rotate individually, similarly to the arm 10.

One of sensors 60 shown in FIGS. 2 to 7 is electrically connected to each of the plurality of sensor boards 40. In FIG. 1, the sensors 60 are not shown for simplicity.

In this embodiment, the sensor board 40 is electrically connected to the sensor 60 different from an encoder that detects rotation of a motor that drives each of the arm 10 and the substrate holding hand 20. That is, in the substrate conveying robot 1, the sensor 60 is provided separately from the encoder (not shown). The encoder is mounted on the substrate conveying robot as standard, and is not supposed to be changed (replaced). Therefore, the sensor 60 targets a sensor different from the encoder such that a user can easily change (replace) the sensor 60 (sensor board 40).

The control board 50 includes a hand control board 51, a base control board 52, and an arm control board 53. The sensor board 40 includes a hand sensor board 41, a base sensor board 42, and an arm sensor board 43.

The hand control board 51 is provided in the vicinity of the substrate holding hand 20. Specifically, the hand control board 51 is provided inside the substrate holding hand 20. The hand control board 51 may be provided outside the substrate holding hand 20. For example, the hand control board 51 may be provided at a connection between the substrate holding hand 20 and the second arm 10b.

The base control board 52 is provided on the base 30. The arm control board 53 is provided on the arm 10. Specifically, the arm control board 53 is provided on the second arm 10b. The arm control board 53 may be provided on the first arm 10a, for example.

The base control board 52 communicates with the robot controller 2. Detection signals by the sensors 60 shown in FIGS. 2 to 7 are collected on the base control board 52, and the detection signals are transmitted from the base control board 52 to the robot controller 2. Furthermore, a command signal regarding driving of the substrate conveying robot 1 is transmitted from the robot controller 2 to the base control board 52.

In this embodiment, the control board 50 establishes a serial communication connection with the robot controller 2 configured or programmed to control the substrate conveying robot main body 11 via a communicator 54c and a communication connector 56 described below. Specifically, serial communication is performed between the robot controller 2, the base control board 52, the arm control board 53, and the hand control board 51.

Specifically, a serial communication connection is established by daisy chain connection via the communicator 54c and the communication connector 56, which are described below, of each of the hand control board 51, the arm control board 53, and the base control board 52 between the robot controller 2, the hand control board 51, the arm control board 53, and the base control board 52.

That is, a serial communication connection is established between the robot controller 2 and the base control board 52. Furthermore, a serial communication connection is established between the base control board 52 and the arm control board 53. Moreover, a serial communication connection is established between the arm control board 53 and the hand control board 51. The base control board 52 receives the detection value of the hand sensor board 41 transmitted from the hand control board 51 via the arm control board 53. The base control board 52 receives the detection value of the arm sensor board 43 transmitted from the arm control board 53. The base control board 52 transmits each of the received detection value of the hand sensor board 41 and the arm sensor board 43 to the robot controller 2.

The base control board 52 transmits, to the arm control board 53, a command signal for the arm 10 transmitted from the robot controller 2. Furthermore, the base control board 52 transmits, to the hand control board 51 via the arm control board 53, a command signal for the substrate holding hand 20 transmitted from the robot controller 2.

The substrate conveying robot 1 moves up and down with respect to a substantially columnar housing 90 by an arm raising and lowering mechanism (not shown) that raises and lowers the arm 10. Specifically, the substrate holding hand 20, the arm 10, and the base 30 move up and down integrally with the housing 90.

The hand control board 51, the base control board 52, and the arm control board 53 have the same configuration as each other. Therefore, in the following description, the same reference numerals are given to the common components mounted on the hand control board 51, the base control board 52, and the arm control board 53. When the control board 50 is described in the following description, it is assumed that the control board 50 has features common to each of the hand control board 51, the base control board 52, and the arm control board 53. When the sensor board 40 is described in the following description, it is assumed that the sensor board 40 has features common to each of the hand sensor board 41, the base sensor board 42, and the arm sensor board 43.

Figure 2:
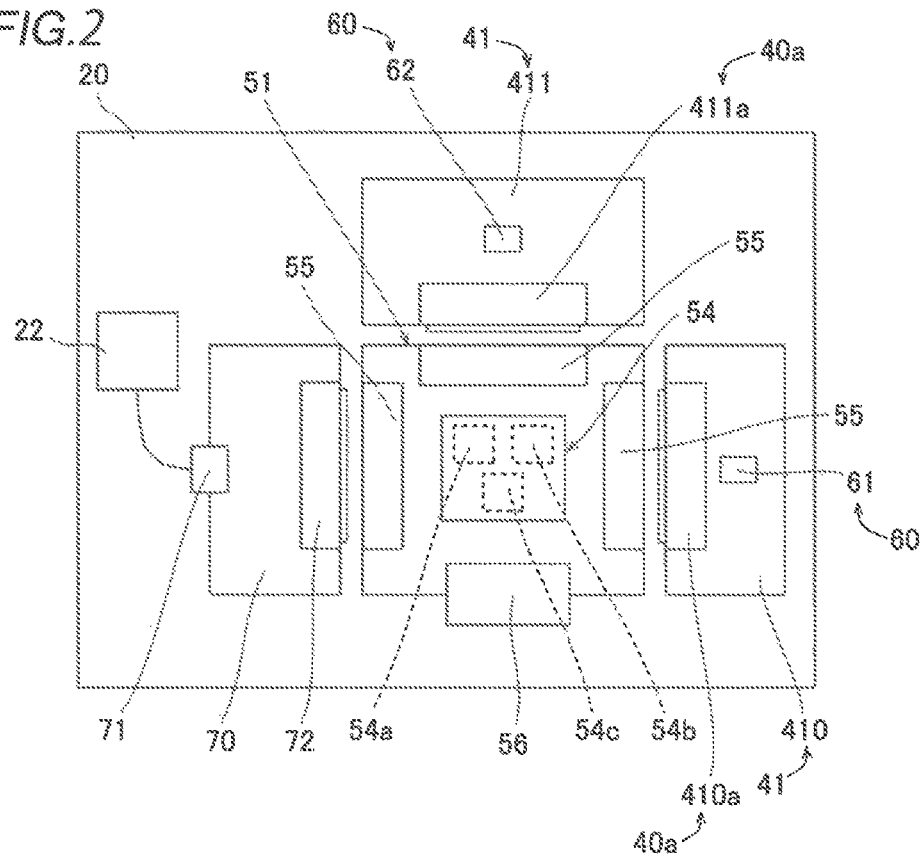
FIG. 2 is a schematic view of a hand control board and a hand sensor board according to the embodiment of the present disclosure.

As shown in FIG. 2, the hand control board 51 includes a controller 54, universal connectors 55, and the communication connector 56. Each of the controller 54, the universal connectors 55, and the communication connector 56 is mounted on the hand control board 51.

The controller 54 includes a CPU 54a, a memory 54b, and the communicator 54c. A program executed by the CPU 54a, for example, is stored in the memory 54b. The communicator 54c performs the above serial communication via the communication connector 56.

The hand sensor board 41 is provided in the vicinity of the substrate holding hand 20. Specifically, the hand sensor board 41 is provided inside the substrate holding hand 20. The hand sensor board 41 may be provided outside the substrate holding hand 20. For example, the hand sensor board 41 may be provided at the connection between the substrate holding hand 20 and the second arm 10b.

The sensor board 40 includes a substrate detection sensor board 410 and a substrate gripping sensor board 411. A substrate detection sensor 61 that detects the semiconductor wafer W shown in FIG. 1 is mounted on the substrate detection sensor board 410. A substrate gripping sensor 62 that detects that the semiconductor wafer W is gripped by the blades 21 shown in FIG. 1 of the substrate holding hand 20 is mounted on the substrate gripping sensor board 411. The substrate detection sensor 61 may not be mounted on the substrate detection sensor board 410, but may be electrically connected to the substrate detection sensor board 410 by a wire. Furthermore, the substrate gripping sensor 62 may not be mounted on the substrate gripping sensor board 411, but may be electrically connected to the substrate gripping sensor board 411 by a wire. Each of the substrate detection sensor 61 and the substrate gripping sensor 62 is an example of a sensor. Each of the substrate detection sensor board 410 and the substrate gripping sensor board 411 is an example of a hand sensor board.

The substrate conveying robot 1 includes a power output board 70 on which a power output electronic component 71 is mounted. The power output board 70 outputs power to a vacuum valve 22 via the power output electronic component 71, for example. The vacuum valve 22 is used to suction the semiconductor wafer W by the substrate holding hand 20. In an example shown in FIG. 2, the power output board 70 is provided inside the substrate holding hand 20. The power output board 70 may be provided outside the substrate holding hand 20. For example, the power output board 70 may be provided at the connection between the substrate holding hand 20 and the second arm 10b.

In this embodiment, the universal connectors 55 can be connected to different types of sensor boards 40. In other words, the universal connectors 55 can be connected to at least two types of sensor boards 40. For example, the universal connectors 55 of the hand control board 51 can be connected to any of the substrate detection sensor board 410, the substrate gripping sensor board 411, and a sensor board 412 shown in FIG. 3, which is described below.

The control board 50 and the sensor board 40 are connected to each other such that the control board 50 and the sensor board 40 can be provided separately from each other. Thus, each of the control board 50 and the sensor board 40 can be easily arranged in a relatively narrow space.

In the substrate conveying robot, a plurality of sensors are generally attached in the vicinity of the substrate holding hand. In addition, the demand for sensors is increasing with the sophistication of semiconductor manufacturing equipment. On the other hand, space saving is required in the substrate conveying robot. Therefore, there is often not enough space in the vicinity of the substrate holding hand to install the sensors. Furthermore, a plurality of wires are required to send information acquired by the sensors to a base of the substrate holding hand, and thus a sufficient wiring space may not be often provided. Therefore, the control board 50 and the sensor board 40 are provided separately, as described above, such that the control board 50 and the sensor board 40 can be arranged separately from each other in the vicinity of the substrate holding hand 20. Consequently, both the control board 50 and the sensor board 40 can be easily arranged in the vicinity of the substrate holding hand 20. Furthermore, the user can freely change the configuration of the sensors in the vicinity of the substrate holding hand 20 while achieving space saving and wiring saving. Thus, the versatility of the substrate constituting robot 1 can be increased.

The control board 50 receives identification signals of the sensor boards 40 from the sensor boards 40 connected to the universal connectors 55. Thus, the CPU 54a of the control board 50 can identify the type of sensor board 40 connected to each of the universal connectors 55.

The control board 50 supplies a voltage to the sensor boards 40 connected to the universal connectors 55 via the universal connectors 55. Specifically, the control board 50 supplies at least one of a low voltage of 5 V or a high voltage of 24 V to a predetermined sensor board 40.

In this embodiment, the control board 50 includes a plurality of universal connectors 55. That is, each of the plurality of universal connectors 55 provided on the control board 50 can be connected to different types of sensor boards 40. For example, each of the plurality of universal connectors 55 provided on the hand control board 51 can be connected to any of the substrate detection sensor board 410, the substrate gripping sensor board 411, and the sensor board 412 shown in FIG. 3, which is described below. The plurality of universal connectors 55 have the same shape as each other.

The universal connector 55 of the control board 50 is provided along each of three sides of the four sides of the control board 50 having a rectangular shape. The communication connector 56 of the control board 50 is provided along the remaining one side of the control board 50 on which the universal connector 55 is not provided.

The sensor board 40 includes a sensor board connector 40a connected to the universal connector 55. For example, the substrate detection sensor board 410 includes a substrate detection sensor board connector 410a. The substrate gripping sensor board 411 includes a substrate gripping sensor board connector 411a. Each of the substrate detection sensor board connector 410a and the substrate gripping sensor board connector 411a is an example of a sensor board connector.

In this embodiment, the sensor board connectors 40a of different types of sensor boards 40 have the same shape as each other. Specifically, the sensor board connectors 40a of different types of sensor boards 40 have the same size as each other and include a plurality of pins (not shown) in common with each other. The different types of sensor boards 40 use different pins from each other based on information transmitted to and received from the connected control board 50 among the plurality of pins described above.

The power output board 70 includes a power output board connector 72 that can be connected to the universal connector 55 of the hand control board 51. The power output board connector 72 has the same shape as the substrate detection sensor board connector 410a and the substrate gripping sensor board connector 411a. The power output board connector 72 can be connected to any of the three universal connectors 55 of the hand control board 51.

Figure 3:
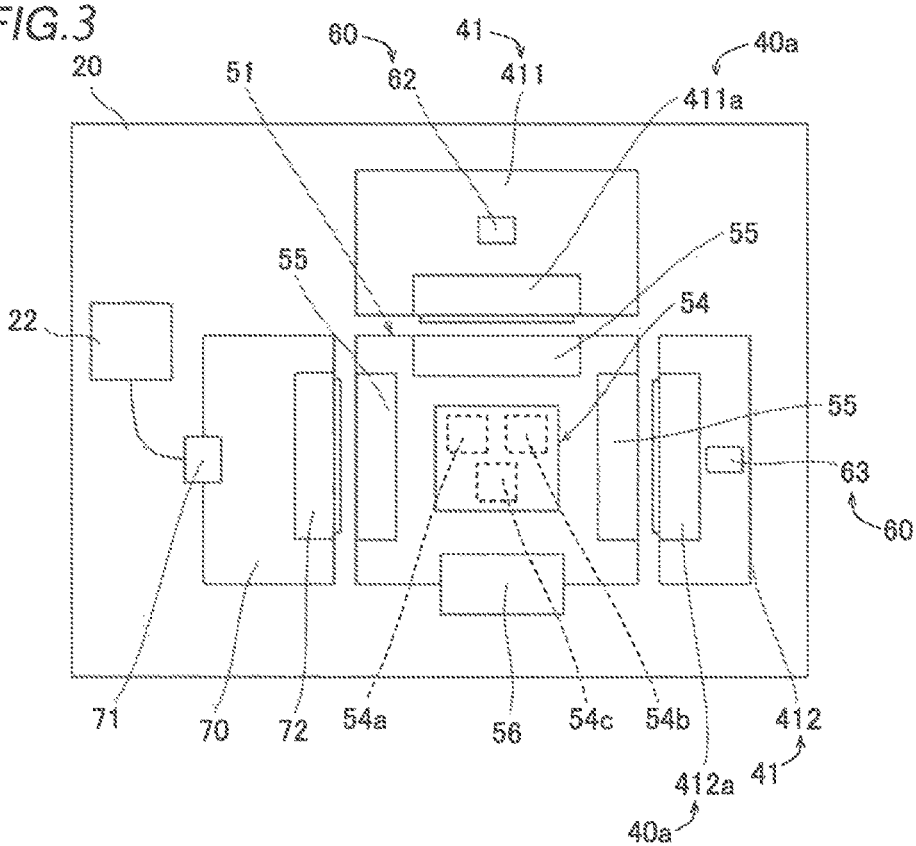
FIG. 3 is a schematic view of the hand control board according to the embodiment of the present disclosure in which a different type of hand sensor board from that shown in FIG. 2 is connected.

As shown in FIG. 3, the plurality of universal connectors 55 of the hand control board 51 can be connected to a sensor board 412 different from each of the substrate detection sensor board 410, the substrate gripping sensor board 411, and the power output board 70. That is, the sensor board 412 can be connected to any of the three universal connectors 55 of the hand control board 51. In an example shown in FIG. 3, the sensor board 412 is connected to the universal connector 55 instead of the substrate detection sensor board 410 shown in FIG. 2. The sensor board 412 may be connected to the universal connector 55 instead of the substrate gripping sensor board 411 or the power output board 70. That is, any three of the substrate detection sensor board 410, the substrate gripping sensor board 411, the power output board 70, and the sensor board 412 can be connected to the three universal connectors 55 of the hand control board 51. Furthermore, a predetermined sensor 63 and a connector 412a that can be connected to the universal connector 55 are mounted on the sensor board 412. The connector 412a has the same shape as each of the substrate detection sensor board connector 410a, the substrate gripping sensor board connector 411a, and the power output board connector 72 shown in FIG. 2. The sensor board 412 and the connector 412a are examples of a hand sensor board and a sensor board connector, respectively. The predetermined sensor 63 is an example of a sensor. For example, the predetermined sensor 63 includes a friction sensor that detects a frictional force between the semiconductor wafer W and the substrate holding hand 20.

The sensor board 412 may be provided on the substrate holding hand 20 in advance, or may be introduced into the substrate holding hand 20 when the substrate detection sensor board 410, for example, is replaced with the sensor board 412.

Figure 4:
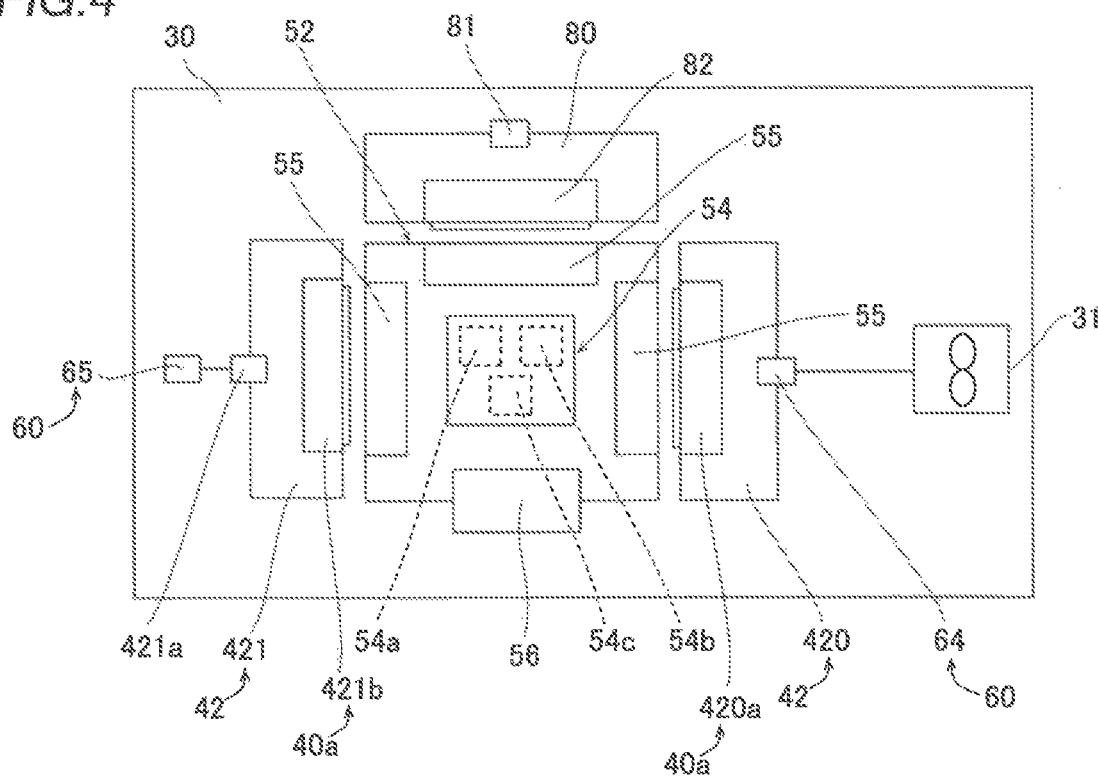
FIG. 4 is a schematic view of a base control board and a base sensor board according to the embodiment of the present disclosure.

As shown in FIG. 4, the sensor board 40 includes a fan sensor board 420 on which a fan sensor 64 is mounted to detect the rotation speed of a fan 31. The fan sensor board 420 is provided on the base 30. In an example shown in FIG. 4, the fan 31 is provided on the base 30, but the arrangement position of the fan 31 is not limited to this. Furthermore, the fan sensor 64 may not be mounted on the fan sensor board 420 but may be electrically connected to the fan sensor board 420 by a wire. The fan sensor board 420 includes a fan sensor board connector 420a. The fan sensor 64 and the fan sensor board connector 420a are examples of a sensor and a sensor board connector, respectively. The fan sensor board 420 is an example of a base sensor board.

The substrate conveying robot 1 includes a communication board 80 on which a communication electronic component 81 is mounted. A serial communication connection is established by daisy chain connection via the communication electronic component 81 between the communication board 80 and the communication connector 56 of the arm control board 53 of the arm 10. In the example shown in FIG. 4, the communication board 80 is provided inside the base 30, but the arrangement position of the communication board 80 is not limited to this. The communication board 80 includes a communication board connector 82.

The substrate conveying robot 1 includes a signal input board 421 on which a signal input electronic component 421a is mounted. The signal input board 421 receives a detection signal from a predetermined sensor 65 via the signal input electronic component 421a. That is, the signal input board 421 is an example of a base sensor board 42. The predetermined sensor 65 is a current sensor that detects a current from the base control board 52, for example. Furthermore, the signal input board 421 includes a signal input board connector 421b. The predetermined sensor 65 and the signal input board connector 421b are examples of a sensor and a sensor board connector, respectively.

In this embodiment, the universal connectors 55 of the base control board 52 can be connected to any of different types of base sensor boards 42. That is, the universal connectors 55 of the base control board 52 can be connected to any of the fan sensor board 420, the signal input board 421, and a sensor board 422 shown in FIG. 5, which is described below.

The communication board 80 can be connected to the universal connector 55 of the base control board 52. That is, the universal connectors 55 of the base control board 52 can be connected to any of the fan sensor board connector 420a of the fan sensor board 420, the signal input board connector 421b of the signal input board 421, and the communication board connector 82 of the communication board 80. The fan sensor board connector 420a, the signal input board connector 421b, and the communication board connector 82 have the same shape as each other. The fan sensor board connector 420a, the signal input board connector 421b, and the communication board connector 82 have the same shapes as those of the substrate detection sensor board connector 410a, the substrate gripping sensor board connector 411a, and the power output board connector 72 shown in FIG. 2.

Figure 5:
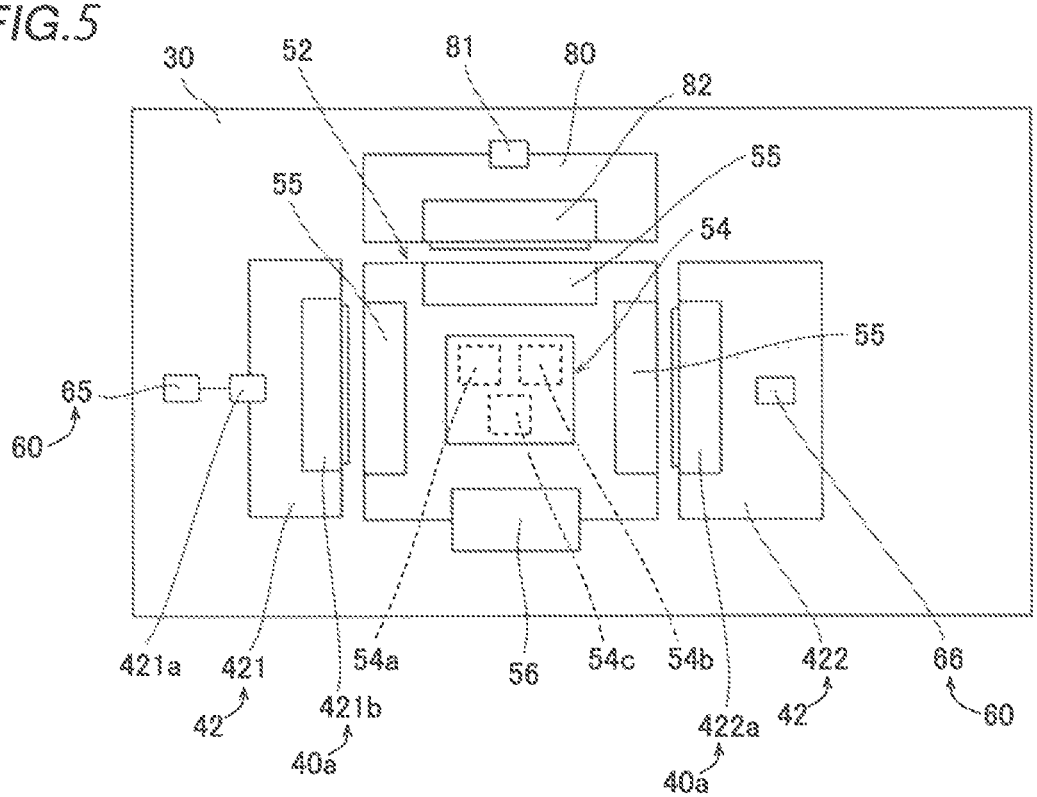
FIG. 5 is a schematic view of the base control board according to the embodiment of the present disclosure in which a different type of base sensor board from that shown in FIG. 4 is connected.

As shown in FIG. 5, the plurality of universal connectors 55 of the base control board 52 can be connected to a sensor board 422 different from each of the fan sensor board 420, the communication board 80, and the signal input board 421. That is, the sensor board 422 can be connected to any of the three universal connectors 55 of the base control board 52. In an example shown in FIG. 5, the sensor board 422 is connected to the universal connector 55 instead of the fan sensor board 420 shown in FIG. 4. The sensor board 422 may be connected to the universal connector 55 instead of the communication board 80 or the signal input board 421. That is, any three of the fan sensor board 420, the communication board 80, the signal input board 421, and the sensor board 422 can be connected to the three universal connectors 55 of the base control board 52. Furthermore, a predetermined sensor 66 is mounted on the sensor board 422. The predetermined sensor 66 is a voltage sensor that detects a voltage from the base control board 52, for example. The sensor board 422 includes a connector 422a that can be connected to the universal connector 55. The connector 422a has the same shape as each of the fan sensor board connector 420a, the signal input board connector 421b, and the communication board connector 82 shown in FIG. 4. The predetermined sensor 66 and the connector 422a are examples of a sensor and a sensor board connector, respectively. The sensor board 422 is an example of a base sensor board.

The sensor board 422 may be provided on the base 30 in advance, or may be introduced into the base 30 when the fan sensor board 420, for example, is replaced with the sensor board 422.

Figure 6:
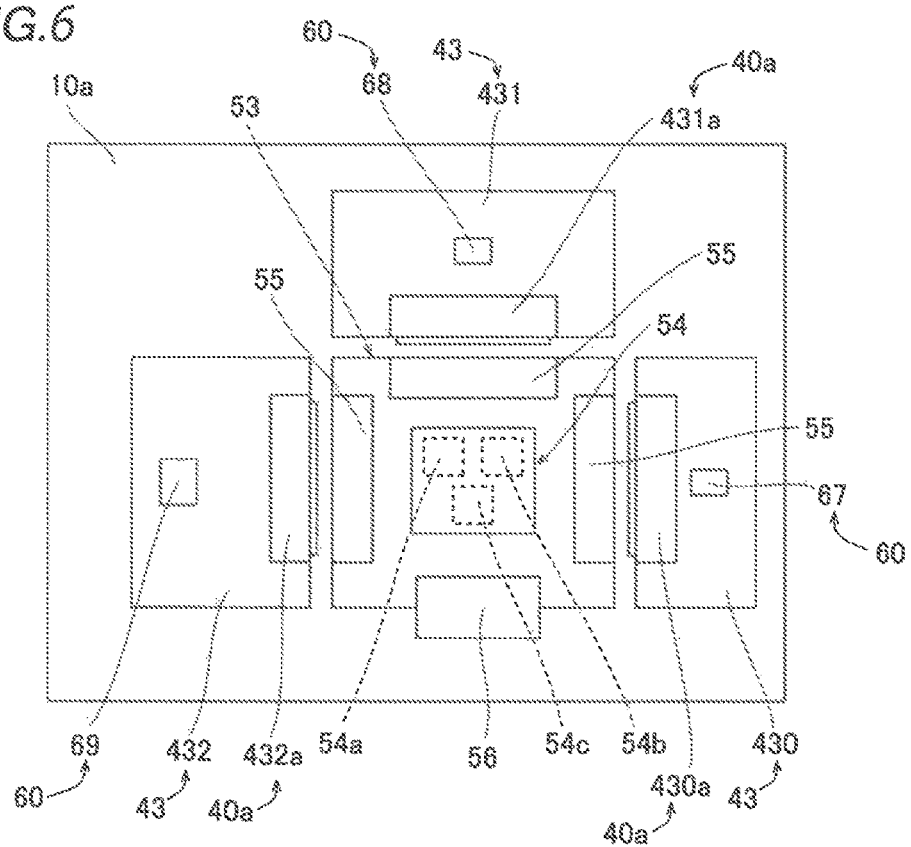
FIG. 6 is a schematic view of an arm control board and an arm sensor board according to the embodiment of the present disclosure.

As shown in FIG. 6, the arm sensor board 43 is provided on the arm 10. Specifically, the arm sensor board 43 is provided on the second arm 10b. The arm sensor board 43 may be provided on the first arm 10a.

The arm sensor board 43 includes a pressure sensor board 430, an acceleration sensor board 431, and a temperature sensor board 432. A pressure sensor 67 that detects a pressure is mounted on the pressure sensor board 430. An acceleration sensor 68 that detects an acceleration is mounted on the acceleration sensor board 431. Furthermore, a temperature sensor 69 that detects a temperature is mounted on the temperature sensor board 432. The pressure sensor 67 may not be mounted on the pressure sensor board 430, but may be electrically connected to the pressure sensor board 430 by a wire. The acceleration sensor 68 may not be mounted on the acceleration sensor board 431, but may be electrically connected to the acceleration sensor board 431 by a wire. The temperature sensor 69 may not be mounted on the temperature sensor board 432, but may be electrically connected to the temperature sensor board 432 by a wire. The pressure sensor 67, the acceleration sensor 68, and the temperature sensor 69 are examples of a sensor. The pressure sensor board 430, the acceleration sensor board 431, and the temperature sensor board 432 are examples of an arm sensor board.

In this embodiment, the universal connectors 55 of the arm control board 53 can be connected to any of different types of arm sensor boards 43. Specifically, each of the plurality of universal connectors 55 of the arm control board 53 can be connected to any of the pressure sensor board 430, the acceleration sensor board 431, the temperature sensor board 432, and a sensor board 433 shown in FIG. 7, which is described below.

Specifically, the pressure sensor board 430 includes a pressure sensor board connector 430a that can be connected to the universal connector 55. The acceleration sensor board 431 includes an acceleration sensor board connector 431a that can be connected to the universal connector 55. The temperature sensor board 432 includes a temperature sensor board connector 432a that can be connected to the universal connector 55. The pressure sensor board connector 430a, the acceleration sensor board connector 431a, and the temperature sensor board connector 432a have the same shape as each other. The shapes of the pressure sensor board connector 430a, the acceleration sensor board connector 431a, and the temperature sensor board connector 432a are the same as those of the substrate detection sensor board connector 410a, the substrate gripping sensor board connector 411a, and the power output board connector 72 shown in FIG. 2. Furthermore, the shapes of the pressure sensor board connector 430a, the acceleration sensor board connector 431a, and the temperature sensor board connector 432a are the same as those of the fan sensor board connector 420a, the communication board connector 82, and the signal input board connector 421b shown in FIG. 4. The pressure sensor board connector 430a, the acceleration sensor board connector 431a, and the temperature sensor board connector 432a are examples of a sensor board connector.

Figure 7:
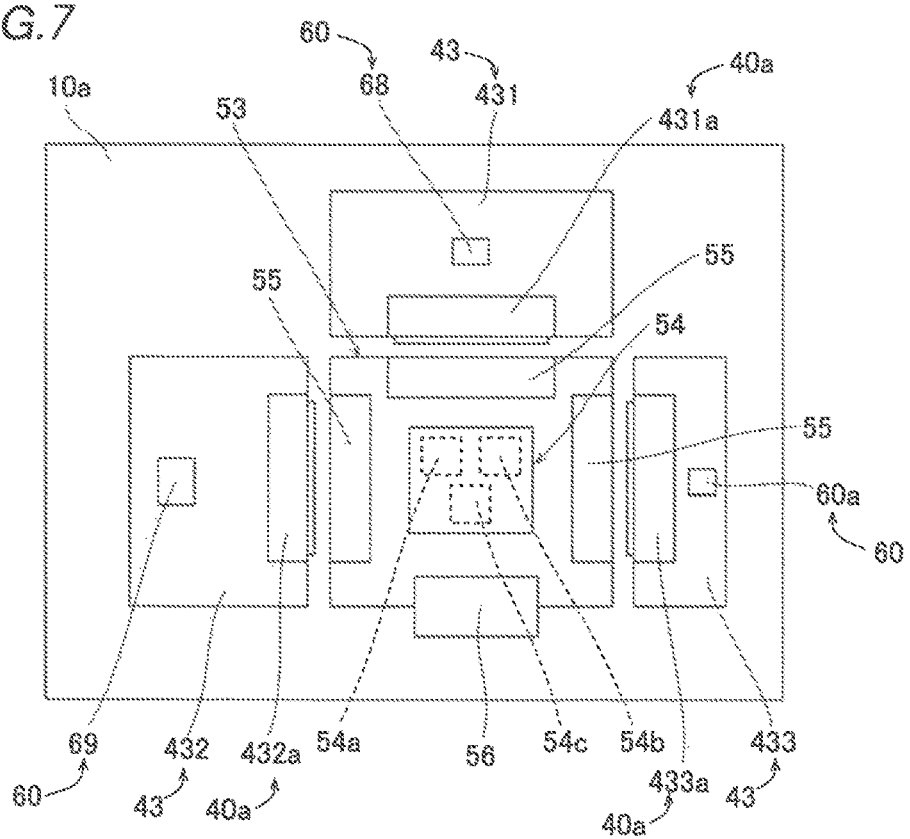
FIG. 7 is a schematic view of the arm control board according to the embodiment of the present disclosure in which a different type of arm sensor board from that shown in FIG. 6 is connected.

As shown in FIG. 7, the plurality of universal connectors 55 of the arm control board 53 can be connected to the sensor board 433 different from each of the pressure sensor board 430, the acceleration sensor board 431, and the temperature sensor board 432. That is, the sensor board 433 can be connected to any of the three universal connectors 55 of the arm control board 53. In an example shown in FIG. 7, the sensor board 433 is connected to the universal connector 55 instead of the pressure sensor board 430 shown in FIG. 6. The sensor board 433 may be connected to the universal connector 55 instead of the acceleration sensor board 431 or the temperature sensor board 432. That is, any three of the pressure sensor board 430, the acceleration sensor board 431, the temperature sensor board 432, and the sensor board 433 can be connected to the three universal connectors 55 of the arm control board 53. Furthermore, a predetermined sensor 60a is mounted on the sensor board 433. The predetermined sensor 60a is an angular acceleration sensor, for example. The sensor board 433 includes a connector 433a that can be connected to the universal connector 55. The connector 433a has the same shape as that of each of the pressure sensor board connector 430a, the acceleration sensor board connector 431a, and the temperature sensor board connector 432a shown in FIG. 6. The sensor board 433 and the connector 433a are examples of an arm sensor board and a sensor board connector, respectively. The predetermined sensor 60a is an example of a sensor.

The sensor board 433 may be provided on the arm 10 in advance, or may be introduced into the arm 10 when the pressure sensor board 430 is replaced with the sensor board 433.

Advantages of This Embodiment

The substrate conveying robot 1 includes the control board 50 including the universal connectors 55 that can be connected to the different types of sensor boards 40. Accordingly, the control board 50 can acquire the detection value of the sensor 60 from each of a plurality of types of sensor boards 40 via one universal connector 55. Consequently, the type of sensor 60 from which the control board 50 acquires the detection value can be changed simply by changing the type of sensor board 40 connected to the universal connector 55. Thus, the type of sensor 60 from which the detection value is acquired by the control board 50 can be easily changed according to the application and purpose.

The control board 50 includes the plurality of universal connectors 55. Accordingly, the type of sensor board 40 connected to each of the plurality of universal connectors 55 can be changed, and thus the combination of the types of sensors 60 from which the control board 50 acquires the detection values can be easily increased.

The sensor boards 40 include the sensor board connectors 40a connected to the universal connectors 55. The sensor board connectors 40a of the different types of sensor boards 40 have the same shape as each other. Accordingly, the sensor board connectors 40a of the different types of sensor boards 40 have the same shape as each other such that the sensor board connectors 40a of the different types of sensor boards 40 can be easily connected to the common universal connectors 55.

The sensor board 40 is electrically connected to the sensor 60 different from the encoder that detects rotation of the motor that drives each of the arm 10 and the substrate holding hand 20. Accordingly, the type of sensor 60 different from the encoder from which the control board 50 acquires the detection value can be easily changed.

The control board 50 includes the hand control board 51 provided in the vicinity of the substrate holding hand 20. The sensor board 40 includes the hand sensor board 41 provided in the vicinity of the substrate holding hand 20. The hand control board 51 includes the universal connector 55 that can be connected to any of the different types of hand sensor boards 41. Accordingly, the type of sensor 60 for the substrate holding hand 20 from which the hand control board 51 acquires the detection value can be easily changed by changing the type of hand sensor board 41 connected to the universal connector 55.

The substrate conveying robot 1 includes the base 30 on which the arm 10 is arranged. The control board 50 includes the base control board 52 provided on the base 30. The plurality of sensor boards 40 include the base sensor board 42 provided on the base 30. The base control board 52 includes the universal connector 55 that can be connected to any of the different types of base sensor boards 42. Accordingly, the type of sensor 60 for the base 30 from which the base control board 52 acquires the detection value can be easily changed by changing the type of base sensor board 42 connected to the universal connector 55.

The control board 50 includes the arm control board 53 provided on the arm 10. The sensor board 40 includes the arm sensor board 43 provided on the arm 10. The arm control board 53 includes the universal connector 55 that can be connected to any of the different types of arm sensor boards 43. Accordingly, the type of sensor 60 for the arm 10 from which the arm control board 53 acquires the detection value can be easily changed by changing the type of arm sensor board 43 connected to the universal connector 55.

The sensor board 40 includes at least one of the substrate detection sensor board 410 to which the substrate detection sensor 61 that detects the semiconductor wafer W is electrically connected, the pressure sensor board 430 to which the pressure sensor 67 that detects a pressure is electrically connected, the acceleration sensor board 431 to which the acceleration sensor 68 that detects an acceleration is electrically connected, the fan sensor board 420 to which the fan sensor 64 that detects the rotation speed of the fan 31 is electrically connected, the temperature sensor board 432 to which the temperature sensor 69 that detects a temperature is electrically connected, or the substrate gripping sensor board 411 to which the substrate gripping sensor 62 that detects that the semiconductor wafer W is gripped by the blades 21 of the substrate holding hand 20 is electrically connected. Accordingly, at least one of the substrate detection sensor board 410, the pressure sensor board 430, the acceleration sensor board 431, the fan sensor board 420, the temperature sensor board 432, or the substrate gripping sensor board 411 can be easily connected to the control board 50 by the universal connector 55.

The substrate conveying robot 1 includes the communication board 80 on which the communication electronic component 81 is mounted and that can be connected to the universal connector 55 of the control board 50. Accordingly, the sensor board 40 connected to the universal connector 55 can be easily changed to the communication board 80.

The substrate conveying robot 1 includes the signal input board 421 on which the signal input electronic component 421*a* is mounted and that can be connected to the universal connector 55 of the control board 50, and the power output board 70 on which the power output electronic component 71 is mounted and that can be connected to the universal connector 55 of the control board 50. Accordingly, the sensor board 40 connected to the universal connector 55 can be easily changed to the signal input board 421 or the power output board 70.

The substrate conveying robot 1 includes the substrate conveying robot main body 11 including the arm 10, the substrate holding hand 20, the sensor 60, and the control board 50. The control board 50 includes the communicator 54*c* and the communication connector 56, and establishes a serial communication connection with the robot controller 2 configured or programmed to control the substrate conveying robot main body 11 via the communicator 54*c* and the communication connector 56. Accordingly, a serial communication connection is established between the control board 50 and the robot controller 2 such that an increase in the number of wires between the control board 50 and the robot controller 2 can be significantly reduced or prevented. Consequently, the complexity of wire routing and an increase in the size of the substrate conveying robot 1 can be significantly reduced or prevented.

A serial communication connection is established by daisy chain connection via the communicator 54*c* and the communication connector 56 of each of the hand control board 51 and the arm control board 53 between the robot controller 2, the hand control board 51, and the arm control board 53. Accordingly, a series connection is established by daisy chain connection between the robot controller 2, the hand control board 51, and the arm control board 53, and thus an increase in the number of wires between the robot controller 2 and the substrate conveying robot 1 can be significantly reduced or prevented.

The substrate conveying robot system 100 includes the substrate conveying robot 1 including the control board 50 including the universal connectors 55 that can be connected to the different types of sensor boards 40. Furthermore, the substrate conveying robot 1 includes the control board 50 including the universal connector 55 that can be connected to any of the different types of sensor boards 40. Accordingly, the control board 50 can acquire the detection value of the sensor 60 from each of the plurality of types of sensor boards 40 via one universal connector 55. Consequently, the type of sensor 60 from which the control board 50 acquires the detection value can be easily changed simply by changing the type of sensor board 40 connected to the universal connector 55. Thus, it is possible to provide the substrate conveying robot system 100 in which the type of sensor 60 from which the detection value is acquired by the control board 50 can be easily changed according to the application and purpose.

Modified Examples

The embodiment disclosed this time must be considered as illustrative in all points and not restrictive. The scope of the present disclosure is not shown by the above description of the embodiment but by the scope of claims for patent, and all modifications (modified examples) within the meaning and scope equivalent to the scope of claims for patent are further included.

For example, while the example in which the control board 50 includes the plurality of universal connectors 55 has been shown in the aforementioned embodiment, the present disclosure is not limited to this. The control board 50 may include one universal connector 55.

While the example in which the sensor board connectors 40*a* of the different types of sensor boards 40 have the same shape as each other has been shown in the aforementioned embodiment, the present disclosure is not limited to this. The sensor board connectors 40*a* of the different types of sensor boards 40 may have different shapes from each other.

While the example in which the plurality of universal connectors 55 of the control board 50 have the same shape as each other has been shown in the aforementioned embodiment, the present disclosure is not limited to this. The plurality of universal connectors 55 of the control board 50 may have different shapes from each other.

While the example in which the control board 50 includes the hand control board 51, the base control board 52, and the arm control board 53 has been shown in the aforementioned embodiment, the present disclosure is not limited to this. The control board 50 is simply required to include at least one of the hand control board 51, the base control board 52, or the arm control board 53.

While the example in which the substrate conveying robot 1 includes the communication board 80 has been shown in the aforementioned embodiment, the present disclosure is not limited to this. The substrate conveying robot 1 may not include the communication board 80.

While the example in which the substrate conveying robot 1 includes the signal input board 421 and the power output board 70 has been shown in the aforementioned embodiment, the present disclosure is not limited to this. The substrate conveying robot 1 may not include one or both of the signal input board 421 and the power output board 70.

While the example in which the control board 50 establishes a serial communication connection with the robot controller 2 has been shown in the aforementioned embodiment, the present disclosure is not limited to this. The control board 50 may establish a parallel communication connection with the robot controller 2.

While the example in which a serial communication connection is established by daisy chain connection between the robot controller 2, the hand control board 51, the arm control board 53, and the base control board 52 has been shown in the aforementioned embodiment, the present disclosure is not limited to this. For example, each of the hand control board 51, the arm control board 53, and the base control board 52 may individually establish a communication connection with the robot controller 2.

While the example in which the hand sensor board 41, the base sensor board 42, and the arm sensor board 43 are connected to the hand control board 51, the base control board 52, and the arm control board 53, respectively has been shown in the aforementioned embodiment, the present disclosure is not limited to this. For example, the hand sensor board 41 may be connected to the base control board 52 or the arm control board 53. Alternatively, the base sensor board 42 may be connected to the hand control board 51 or the arm control board 53. Alternatively, the arm sensor board 43 may be connected to the hand control board 51 or the base control board 52.

Figure 8:
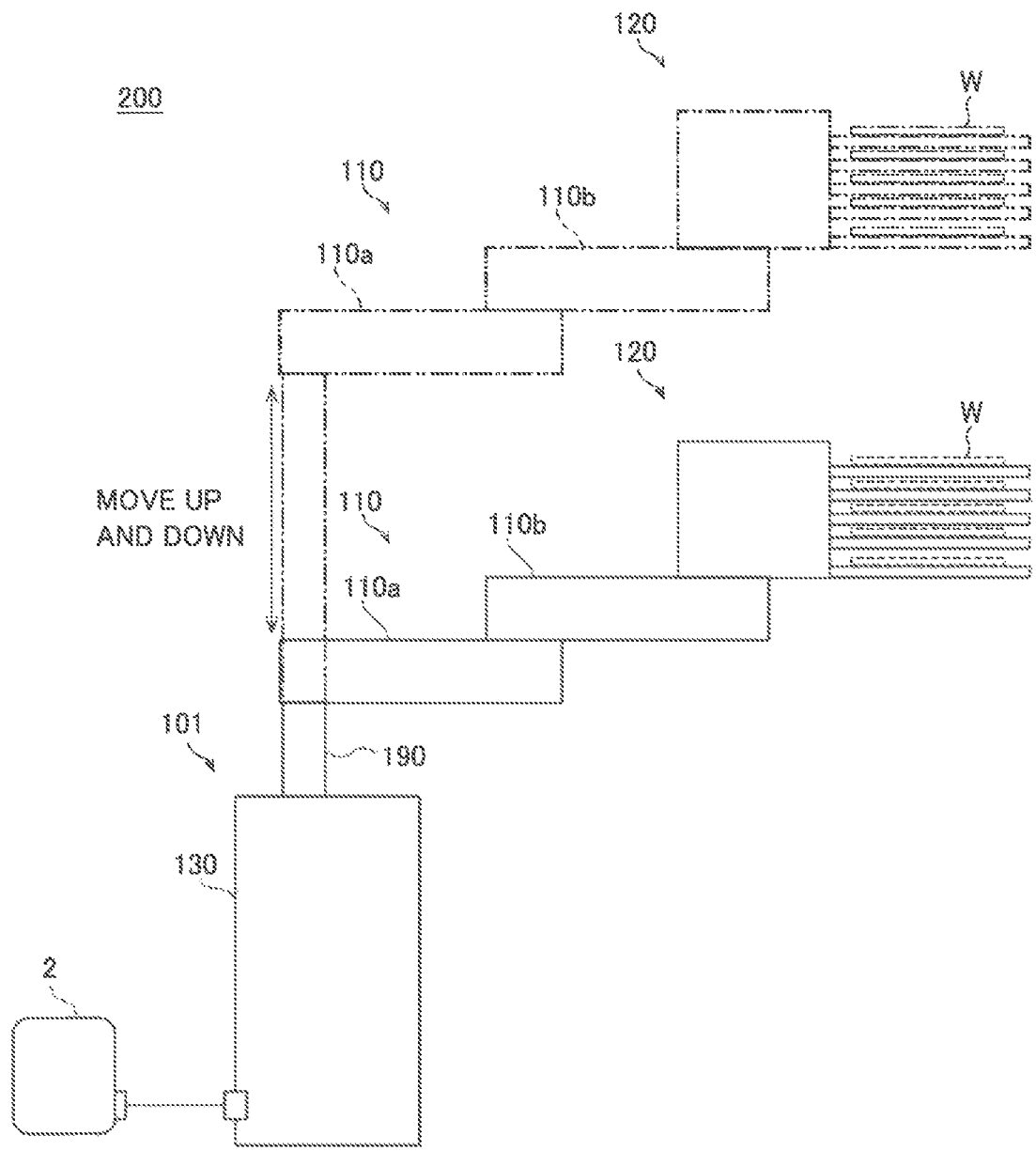
FIG. 8 is a diagram showing the configuration of a substrate conveying robot and a substrate conveying robot system according to a first modified example of the embodiment of the present disclosure.

While the example in which the substrate holding hand 20, the arm 10, and the base 30 move up and down integrally with respect to the housing 90 has been shown in the aforementioned embodiment, the present disclosure is not limited to this. For example, the base may not move up and down. Specifically, as shown in FIG. 8, a substrate conveying robot system 200 includes a substrate conveying robot 101 including a substrate holding hand 120, an arm 110, and a base 130. The arm 110 is attached to the upper end of a raising and lowering mechanism 190 extending upward from the base 130. The raising and lowering mechanism 190 expands and contracts along an upward-downward direction. Thus, the base 130 does not move up and down, but the arm 110 and the substrate holding hand 120 move up and down integrally as the raising and lowering mechanism 190 expands and contracts.

Figure 9:
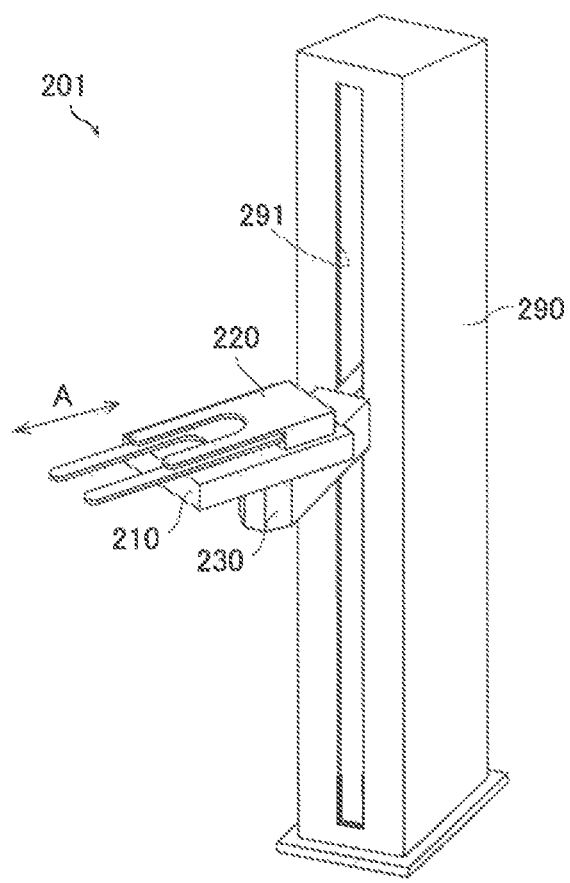
FIG. 9 is a diagram showing the configuration of a substrate conveying robot according to a second modified example of the embodiment of the present disclosure.

While the example in which the substrate holding hand 20 is rotatably provided with respect to the arm 10 has been shown in the aforementioned embodiment, the present disclosure is not limited to this. The substrate holding hand may be linearly movably provided with respect to the arm. For example, as shown in FIG. 9, a substrate conveying robot 201 includes a substrate holding hand 220, an arm 210, and a base 230. The base 230 extends from the inside of a housing 290 to the outside of the housing 290 through an opening 291 provided in the housing 290. The opening 291 extends along an upward-downward direction. Furthermore, the arm 210 is fixed to the base 220 outside the housing 290. The substrate holding hand 220 is placed on a portion of the arm 210 outside the housing 290. The substrate holding hand 220 is linearly movably provided on the arm 210 along an A direction. Furthermore, the substrate holding hand 220, the arm 210, and the base 230 move up and down integrally along the opening 291.

While the example in which the substrate conveying robot 1 is a horizontal articulated robot has been shown in the aforementioned embodiment, the present disclosure is not limited to this. For example, the substrate conveying robot may be a vertical articulated robot.

What is claimed is:

1. A substrate conveying robot comprising:
   an arm;
   a substrate holding hand moved by the arm, movably connected to the arm, and including a blade to support a substrate;
   a sensor board to which a sensor is electrically connected; and
   a control board on which a controller is mounted, the control board including a universal connector connectable to different types of the sensor boards, wherein
   the control board includes a hand control board provided inside the substrate holding hand;
   the sensor board includes a substrate detection sensor board to which a substrate detection sensor that detects the substrate is electrically connected and a substrate gripping sensor board to which a substrate gripping sensor that detects that the substrate is gripped by the blade of the substrate holding hand is electrically connected, as hand sensor boards provided inside the substrate holding hand,
   the hand control board includes the universal connector connectable to both the substrate detection sensor board and the substrate gripping sensor board.

2. The substrate conveying robot according to claim 1, wherein the control board includes a plurality of the universal connectors.

3. The substrate conveying robot according to claim 2, wherein
   the sensor boards include sensor board connectors connected to the universal connectors; and
   the sensor board connectors of the different types of the sensor boards have a same shape as each other.

4. The substrate conveying robot according to claim 1, wherein the sensor board is electrically connected to the sensor different from an encoder that detects rotation of a motor that drives each of the arm and the substrate holding hand.

5. The substrate conveying robot according to claim 1, further comprising:
   a base on which the arm is arranged; wherein
   the control board includes a base control board provided on the base;
   the sensor board includes a base sensor board provided on the base; and
   the base control board includes the universal connector connectable to any of different types of the base sensor boards.

6. The substrate conveying robot according to claim 1, wherein
   the control board includes an arm control board provided on the arm;
   the sensor board includes an arm sensor board provided on the arm; and
   the arm control board includes the universal connector connectable to any of different types of the arm sensor boards.

7. The substrate conveying robot according to claim 1, wherein
   the sensor board includes at least one of:
   a pressure sensor board to which a pressure sensor that detects a pressure is electrically connected;

an acceleration sensor board to which an acceleration sensor that detects an acceleration is electrically connected;
a fan sensor board to which a fan sensor that detects a rotation speed of a fan is electrically connected; or
a temperature sensor board to which a temperature sensor that detects a temperature is electrically connected.

8. The substrate conveying robot according to claim 1, further comprising:
a communication board on which a communication electronic component is mounted, the communication board being connectable to the universal connector of the control board.

9. The substrate conveying robot according to claim 1, further comprising:
a signal input board on which a signal input electronic component is mounted, the signal input board being connectable to the universal connector of the control board; and
a power output board on which a power output electronic component is mounted, the power output board being connectable to the universal connector of the control board.

10. The substrate conveying robot according to claim 1, further comprising:
a substrate conveying robot main body including the arm, the substrate holding hand, the sensor, and the control board; wherein
the control board includes a communicator and a communication connector, and establishes a serial communication connection with a robot controller configured or programmed to control the substrate conveying robot main body via the communicator and the communication connector.

11. The substrate conveying robot according to claim 10, wherein
the control board includes:
a hand control board provided inside the substrate holding hand; and
an arm control board provided on the arm; and
a serial communication connection is established by daisy chain connection via the communicator and the communication connector of each of the hand control board and the arm control board between the robot controller, the hand control board, and the arm control board.

12. A substrate conveying robot system comprising:
a substrate conveying robot; and
a robot controller configured or programmed to control the substrate conveying robot; wherein
the substrate conveying robot includes:
an arm;
a substrate holding hand moved by the arm, movably connected to the arm, and including a blade to support a substrate;
a sensor board to which a sensor is electrically connected; and
a control board on which a controller is mounted, the control board including a universal connector connectable to different types of the sensor boards; wherein
the control board includes a hand control board provided inside the substrate holding hand;
the sensor board includes a substrate detection sensor board to which a substrate detection sensor that detects the substrate is electrically connected and a substrate gripping sensor board to which a substrate gripping sensor that detects that the substrate is gripped by the blade of the substrate holding hand is electrically connected, as hand sensor boards provided inside the substrate holding hand,
the hand control board includes the universal connector connectable to both the substrate detection sensor board and the substrate gripping sensor board.

* * * * *